United States Patent [19]

Nakanishi et al.

[11] Patent Number: 4,626,812
[45] Date of Patent: Dec. 2, 1986

[54] ELECTROMAGNETIC RELAY FOR SWITCHING HIGH FREQUENCY SIGNALS

[75] Inventors: Youichi Nakanishi, Kyoto; Kozo Maenishi, Nagaokakyo, both of Japan

[73] Assignee: Omron Tateisi Electronics Co., Kyoto, Japan

[21] Appl. No.: 639,830

[22] Filed: Aug. 13, 1984

[30] Foreign Application Priority Data

Aug. 12, 1983 [JP] Japan ............................ 58-126061[U]
Oct. 8, 1983 [JP] Japan ................................. 58-188925

[51] Int. Cl.$^4$ ............................................ H01H 67/02
[52] U.S. Cl. ................................. 335/132; 174/35 R; 174/51
[58] Field of Search ...................... 335/132, 202, 278; 174/51, 35 R, 52 R

[56] References Cited

U.S. PATENT DOCUMENTS

| | | | |
|---|---|---|---|
| 3,987,263 | 10/1976 | Ogasawara | 174/35 R |
| 4,218,578 | 8/1980 | Olschewski et al. | 174/35 R |
| 4,316,165 | 2/1982 | Moeller | 174/51 |

*Primary Examiner*—George Harris
*Attorney, Agent, or Firm*—Wegner & Bretschneider

[57] ABSTRACT

An electromagnetic relay has a base, a terminal platform and a ground base board. The base is formed with an insertion socket and provided with an electroconductive coating. The terminal platform has terminals and is fitted in the insertion socket. The ground base board is fixed against the base to hold the terminal platform in the socket and to contact the electroconductive coating. The relay has an excellent switching in high frequency and good sealing characteristics are obtained.

13 Claims, 20 Drawing Figures

ELECTROMAGNETIC RELAY FOR SWITCHING HIGH FREQUENCY SIGNALS

BACKGROUND OF THE INVENTION

The present invention relates to an electromagnetic relay, and more particularly relates to an electromagnetic relay which switches high frequency signals. Generally, in such an electromagnetic relay, excellent high frequency properties and high sealability are required.

Conventionally, in such an electromagnetic relay, to the end of obtaining excellent high frequency properties, it has been proposed to ground a ground terminal which is short circuited to an electroconductive thin film for grounding provided on the base by projecting it from the bottom surface of the base so that the interference between the fixed terminals and the external noises may be removed.

Conventionally, it has been widely practiced to mount a high frequency relay on a printed circuit board on which a certain pattern is formed, but with the increasingly smaller design of high frequency relays there is a tendency that the leakage of high frequency signals is increasing due to the fact that the contact terminals of different poles come closer. Therefore, to the end of obtaining stable and favorable high frequency properties, a high frequency relay is known.

However, problem that arises in particular with an electromagnetic relay for switching high frequency current is that of leakage of high frequency current between the various terminals thereof. It has been practiced to shield the body of the relay, and the mechanisms inside it, as much as practicable, but still the problem is not completely solved. Further, often shielding of the relay terminals is performed by providing a plated surface on the outside body of the relay from which the terminals protrude. When the relay is mounted to, for example, a printed circuit board, and is pressed thereagainst so as to engage the terminals well thereto, then this plated surface is brought into contact with a ground surface on the printed circuit board, and is thereby grounded. However, problems have arisen because, since this plated surface is pressed close against the printed circuit board, it is very difficult to eliminate all residue of flux between them. Such residual flux can cause corrosion, both of the terminals and of the plated surface itself, and this can result in poor electrical contact between the plated surface and the ground surface on the board, which can in turn cause unacceptable high leakage of high frequency current.

Another problem that has arisen with such a plated surface on the relay is that it can occur that poor contact happens between the plated surface and the ground terminals which are providing grounding therefor. This is primarily because the joining area or cross section between such a thin film and a ground terminal protruding from the base is extremely limited in its extent.

Yet another important characteristic for such a relay is good sealability, which has in the prior art proved difficult to obtain as a result of inevitable inaccuracies of manufacture.

SUMMARY OF THE INVENTION

It is a primary object of the present invention to provide such an electromagnetic relay, which does not suffer from undue leakage of high frequency current.

It is a further object of the present invention to provide such an electromagnetic relay, which provides continued good contact between a shielding surface thereof and a ground surface on a board to which it is mounted.

It is a yet further object of the present invention to provide such an electromagnetic relay, which is not subject to an accumulation of flux tending to remain between it and a printed circuit board to which it is fitted.

According to one aspect of the present invention, these and other objects are accomplished by an electromagnetic relay, comprising: a base formed with an insertion socket and provided with an electroconductive coating; a terminal platform having terminals mounted therein and fitted in said insertion socket; and a ground base board fixed against said base so as to pressingly hold said terminal platform in said socket and so as to contact said electroconductive coating.

According to such a construction, since the terminal platform is pressingly held into said insertion socket by the terminal platform, very good sealing characteristics are obtained. Further, since the ground base board contacts said electroconductive coating over a plane surface which typically has a large surface area, the grounding of said electroconductive coating is very good, and accordingly shielding of the relay is good and leakage of high frequency current is effectively prevented.

BRIEF DESCRIPTION OF THE DRAWINGS

The present invention will now be shown and described with reference to the preferred embodiments thereof, and with reference to the illustrative drawings, which are all of them given purely for the purposes of explanation and exemplification only, and none of them intended to be limitative of the scope of the present invention in any way. In the drawings, like parts and features are denoted by like reference symbols in FIGS. 1 through 12 thereof, FIGS. 13 through 15 thereof, and FIGS. 16 through 20 thereof, and:

FIG. 4 is a partly broken away side view, similar to FIG. 1, showing the first preferred embodiment of the relay of the present invention, and also showing in section a printed circuit board for mounting it to;

DESCRIPTION OF THE PREFERRED EMBODIMENTS

Figure 1:
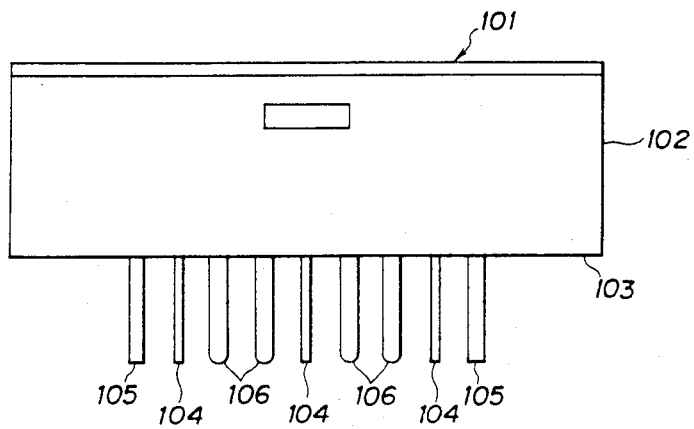
FIG. 1 is a side view of a prior art type of relay.
Figure 2:
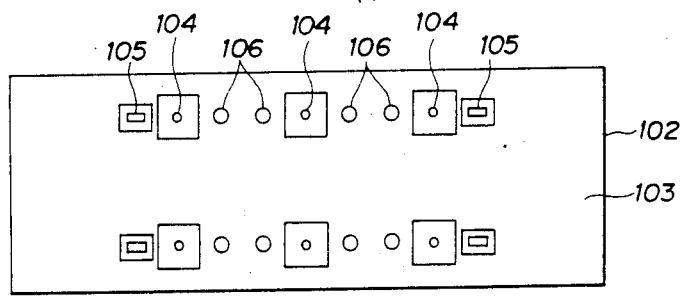
FIG. 2 is a bottom view of the prior art relay of FIG. 1.

The present invention will now be described with reference to the preferred embodiments thereof, and with reference to the appended drawings. In FIGS. 1 and 2 there is shown a prior art type relay, respectively in a side and in a bottom view. This relay is for switching a high frequency current, and it is intended to be mounted on a printed circuit board, not shown. In order to avoid the problem, which is becoming more and more pressing nowadays with the increasingly smaller size of high frequency relays, that the high frequency current tends to leak from one terminal to another because these terminals are being made closer to one another, this known relay 101 of FIGS. 1 and 2 is made as follows. A casing 102 is mounted over a relay mechanism (not shown) fixed on a base 103, and out from the bottom of said base 103 project a plurality of contact terminals 104 for receiving switched signals, a plurality of coil terminals 105 for receiving a switching signal, and a plurality of ground terminals 106. The base 103 is coated both on its external and its internal surfaces with conductive plating such as Cu-Ni plating, except for the immediate surroundings of the contact terminals 104 and the coil terminals 105; and the internal plating and the external plating on said base 103 are electrically connected together, as are also the external plating and the ground terminals 106. Thus, when the relay 101 is mounted on a printed circuit board, not shown, each of the terminals 104, 105, and 106 is poked through a corresponding mounting hole on the printed circuit board, and a ground surface formed on the printed circuit board contacts the ground terminals 106 as well as contacting the plating formed on the outside surface (the lower surface in FIG. 1) of the base 103 of the relay 101.

Figure 3:
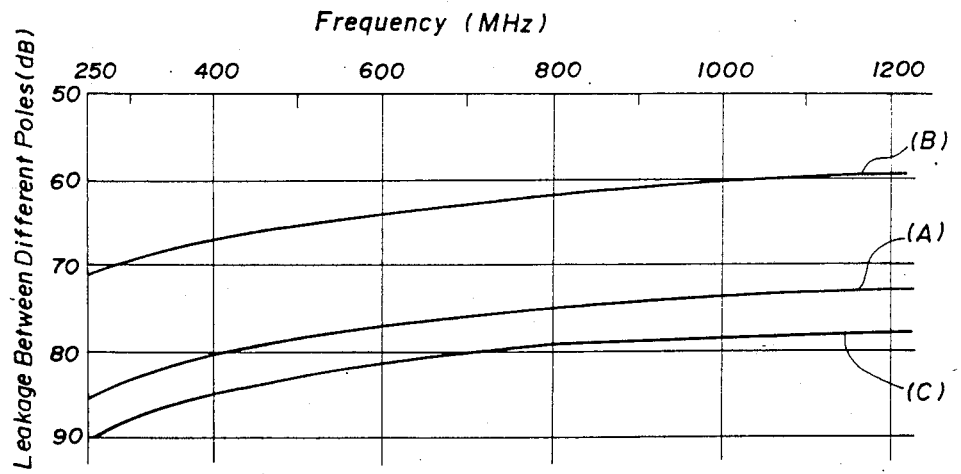
FIG. 3 is a graph, in which signal leakage between different poles is shown in dB and signal frequency is shown in MHz, illustrating the characteristics of leakage both in the prior art relay of FIG. 1 and in the preferred embodiment of the relay of the present invention.

When the grounding contact between the plated outer surface of the base 103 and the ground surface on the printed circuit board is present and good, as well as the grounding contact between the ground terminals 106 and said printed board ground surface, then the amount of leakage of a high frequency switched signal can be as good as −74 dB at 900 MHz, as shown by the exemplary line (A) in FIG. 3. However, problems tend to arise in such a prior art, because since the surface of the printed circuit board and the plated outer surface of the base 103 are in close contact with one another for providing electrical connection, it is very difficult to eliminate any flux that gets in between these two surfaces. Such remaining flux can corrode the terminals, causing bad connections, and further by such corrosion the contact area between the surface of the printed circuit board and the plated outer surface of the base 103 is diminished, thereby deteriorating the high frequency characteristics of the assembly. In such a case, if the electrical connection between the printed circuit board ground surface and the plated outer surface of the base 103 substantially fails, only leaving the electrical connection between the printed circuit board ground surface and the ground terminals 106, then the amount of leakage of a high frequency switched signal can deteriorate to be as bad as −61 dB at 900 MHz, as shown by the exemplary line (B) in FIG. 3.

Figure 4:
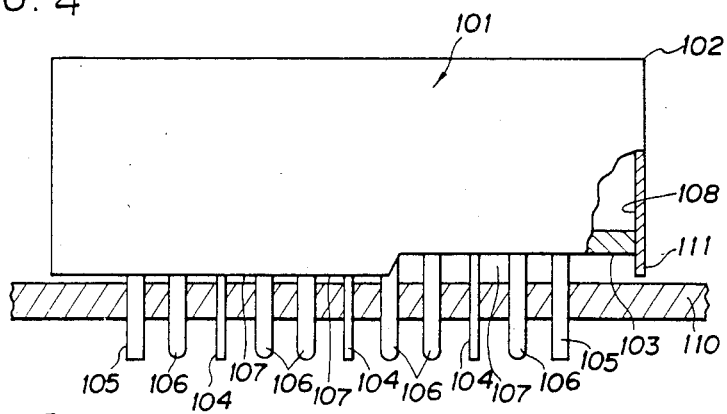
Figure 5:
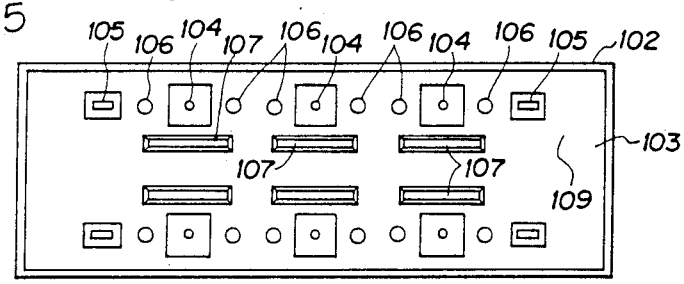
FIG. 5 is a bottom view, similar to FIG. 2, showing said first preferred embodiment of the relay of the present invention.

Now, in FIGS. 4 and 5, a first preferred embodiment of the relay of the present invention is shown, which is so constructed as to avoid the above detailed problems. In this case, again a casing 102 is mounted over a relay mechanism (not shown, but in fact this is a two pole high frequency signal switching unit) fixed on a base 103, and the fringe 111 of the case 102 extends to some distance below the bottom of the base 103, as seen by the cutaway portion of FIG. 4. In the bottom of said base 103 and projecting out therefrom there are fixed: six contact terminals 104 for receiving switched signals, said contact terminals 104 being arranged in two longitudinally extending rows of three each; four coil terminals 105 for receiving a switching signal, each of said coil terminals 105 being provided at one longitudinal end of one of said two rows of three contact terminals 104; twelve ground terminals 106, one of which is provided on each longitudinal side of each of the contact terminals 104; and six stop/shield projections 107, which are much shorter in the vertical direction (perpendicular to the printed circuit board) than the terminals 104, 105, and 106 but are much longer than said terminals in the longitudinal direction, and which are provided one on the inside side of each of the contact terminals 104, being integrally formed with the base 103. Again, the base 103 is coated both on its external and its internal surfaces with conductive plating such as Cu-Ni plating, except for the immediate surroundings of the contact terminals 104 and the coil terminals 105 (according to this, squares and rectangles where the conductive plating is absent are shown in FIG. 5 as surrounding said terminals 104 and 105—this configuration is obtained by masking during the plating process); and the internal plating and the external plating on said base 103 are electrically connected together, as are also the external plating and the ground terminals 106 and also the stop/shield projections 107. The shield plating formed of Cu-Ni on the inside of the case 102 is shown as 108 in FIG. 4. The length of each of the stop/shield projections 107 is slightly longer than the amount by which the fringe 111 of the case 102 projects downwards past the lower surface of the base 103, so that, when the relay 101 is mounted on a printed circuit board 110 as shown in FIG. 5 and is pushed firmly thereagainst, with each of the terminals 104, 105, and 106 poked through a corresponding mounting hole on the printed circuit board, when the ends of the stop/shield projections 107 come into contact with the printed circuit board 110 a certain gap still is left between the fringe 111 of the case 102 and said printed circuit board 110, as well as a larger gap being left between the bottom outer surface of the base 103 and said printed circuit board 110. The end surfaces of the stop/shield projections 107 are flat, so that in this condition they well and properly contact the ground surface formed on the printed circuit board 110 (as well as of course do the ground terminals 106). Also these end surfaces of the stop/shield projections 107 are substantially parallel to the bottom surface of the base 103, again so as to ensure that they properly contact the ground surface of the printed circuit board 110.

Because of this gap left between the bottom outer surface of the base 103 and said printed circuit board 110, according to the provision of the stop/shield projections 107, it is much easier to ensure that no flux becomes trapped therebetween, and accordingly the risk of such trapped flux deteriorating the high frequency shielding characteristics of the relay is effectively prevented. The reason for the configuration shown in FIGS. 4 and 5, with the ground terminals 106 on either side of each of the contact terminals 104, and with the elongated stop/shield projections 107 extending, on the inside side of each of the contact terminals 104, almost between the two corresponding ground terminals 106, is in order to better shield said contact terminals 104. As a modification of the shown embodiment, it would be possible to make each of the projections 107 in the form of a trough, in other words with an arcuate cross section from the point of view of FIG. 5 concave in the direction of the corresponding contact terminal 104; but this has not been done in the shown first preferred embodiment, in view of the desirability of facilitating the work of sealing the relay. Also, it would be possible to make the shown construction by integrally forming the stop/shield projections 107 with the base 103 of the relay, and by performing the Cu-Ni plating thereof later.

In the case of this first preferred embodiment, since the grounding contact between the plated outer surface of the base 103 and the ground surface on the printed circuit board through the projections 107 is virtually guaranteed to be present and good, and supplements effectively the grounding contact between the ground terminals 106 and said printed board ground surface, therefore the amount of leakage of a high frequency switched signal can be as good as −79 dB at 900 MHz, as shown by the exemplary line (C) in FIG. 3.

Figure 6:
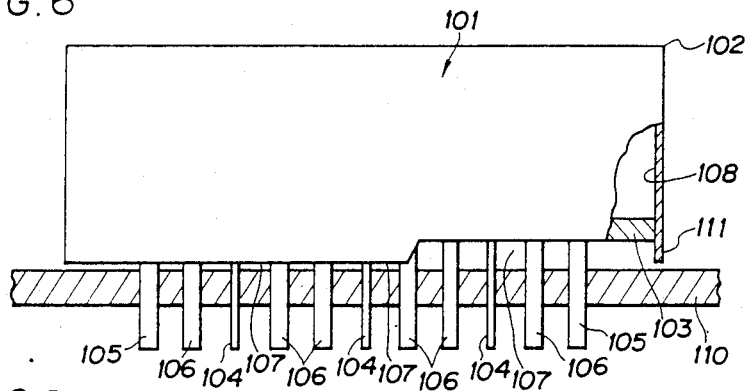
FIG. 6 is a partly broken away side view, similar to FIGS. 1 and 4, showing the second preferred embodiment of the relay of the present invention, and also showing a printed circuit board.
Figure 7:
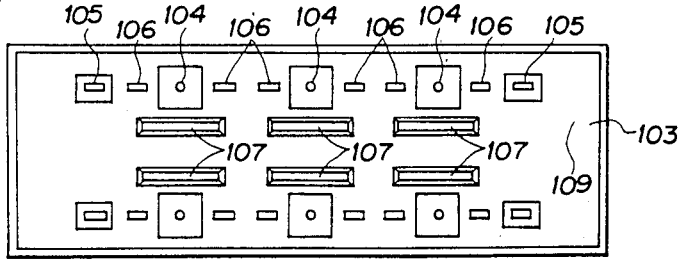
FIG. 7 is a bottom view, similar to FIGS. 2 and 5, showing said second preferred embodiment of the relay of the present invention.

In FIGS. 6 and 7, a second preferred embodiment of the relay of the present invention is shown, in a fashion similar to FIGS. 4 and 5 with regard to the first preferred embodiment. As opposed to the first embodiment, in which the ground terminals 106 were integrally formed with the base 103, according to this embodiment, after forming the ground terminals 106 as reed frame type and then inserting them in the base 103, Cu-Ni plating was performed on the base 103. Thereby, the assembly work was made easier than it was in the first preferred embodiment.

Figure 8:
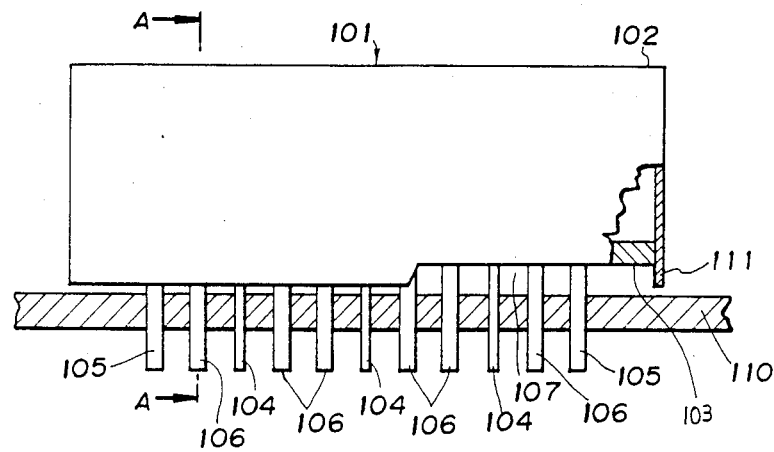
FIG. 8 is a partly broken away side view, similar to FIGS. 1, 4, and 6, showing the third preferred embodiment of the relay of the present invention, and also showing a printed circuit board.
Figure 9:
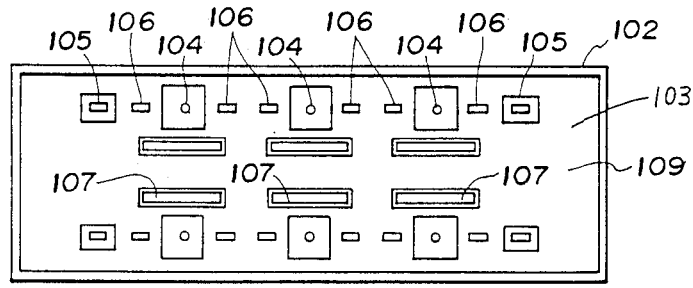
FIG. 9 is a bottom view, similar to FIG. 2, 5, and 7, showing said third preferred embodiment of the relay of the present invention.
Figure 10:
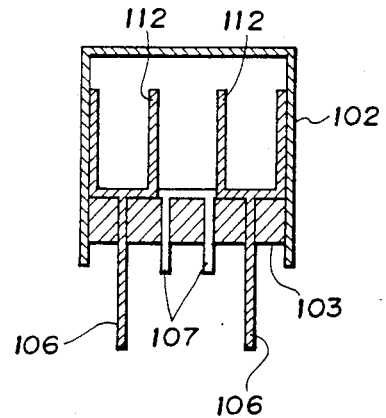
FIG. 10 is a sectional view through said third preferred embodiment, taken in a plane shown by the arrows A—A in FIG. 8.

In FIGS. 8 and 9, a third preferred embodiment of the relay of the present invention is shown, in a fashion similar to FIGS. 4 and 5 with regard to the first preferred embodiment; and FIG. 10 shows a cross sectional view of the relay in a plane shown by the arrows A—A in FIG. 8. As opposed to the first and second preferred embodiments, in which the high frequency insulation for the mechanism of the relay was provided by the Cu-Ni layer 108 on the inside of the case 102, in this second preferred embodiment a shield box 112 is formed from metallic plate and is fitted inside the relay 101 with the grounding terminals 106 and the stop/shield projections 107, which are integrally formed with and attached to said shield box 112, projecting through holes in the base 103, as best seen in section in FIG. 10. Thus, the electrical connection of the stop/shield projections 107 and the ground terminals 106 and the shielding material for the relay is effectively performed by a simple construction, in which plating work and other difficulties during assembly are eliminated.

Figure 11:
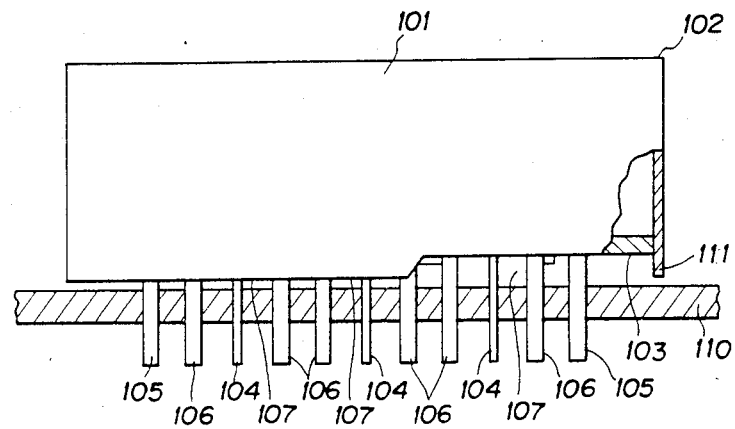
FIG. 11 is a partly broken away side view, similar to FIGS. 1, 4, 6, and 8, showing the fourth preferred embodiment of the relay of the present invention, and also showing a printed circuit board.
Figure 12:
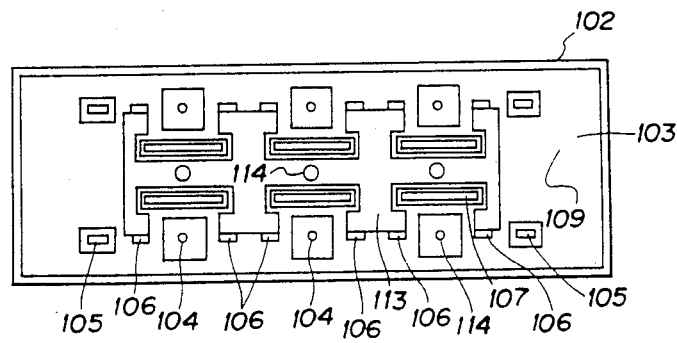
FIG. 12 is a bottom view, similar to FIGS. 2, 5, 7, and 9, showing said fourth preferred embodiment of the relay of the present invention.

In FIGS. 11 and 12, a fourth preferred embodiment of the relay of the present invention is shown, in a fashion similar to FIGS. 4 and 5 with regard to the first preferred embodiment. As opposed to the first and second preferred embodiments, in which the electrical connections between the ground terminals 106 and the stop/shield projections 107 were only made via the Cu-Ni plating on the surface of the base 103, in this fourth preferred embodiment these ground terminals 106 are constituted as downwards bent projections from a connecting body 113 which is made of a metal press formed plate and is fixed on the bottom of the base 103 and is located by projections 114 provided on the bottom surface of said base 103. With this connecting body 113 integrally connecting together the ground terminals 106 and also positively being pressed against and contacting the Cu-Ni plating on the bottom of the base 103 which is contacted with the stop/shield projections 107, the electrical connection between the ground terminals 106 and the stop/shield projections 107 is much more positively assured, and accordingly electrical integrity is improved.

Figure 13:
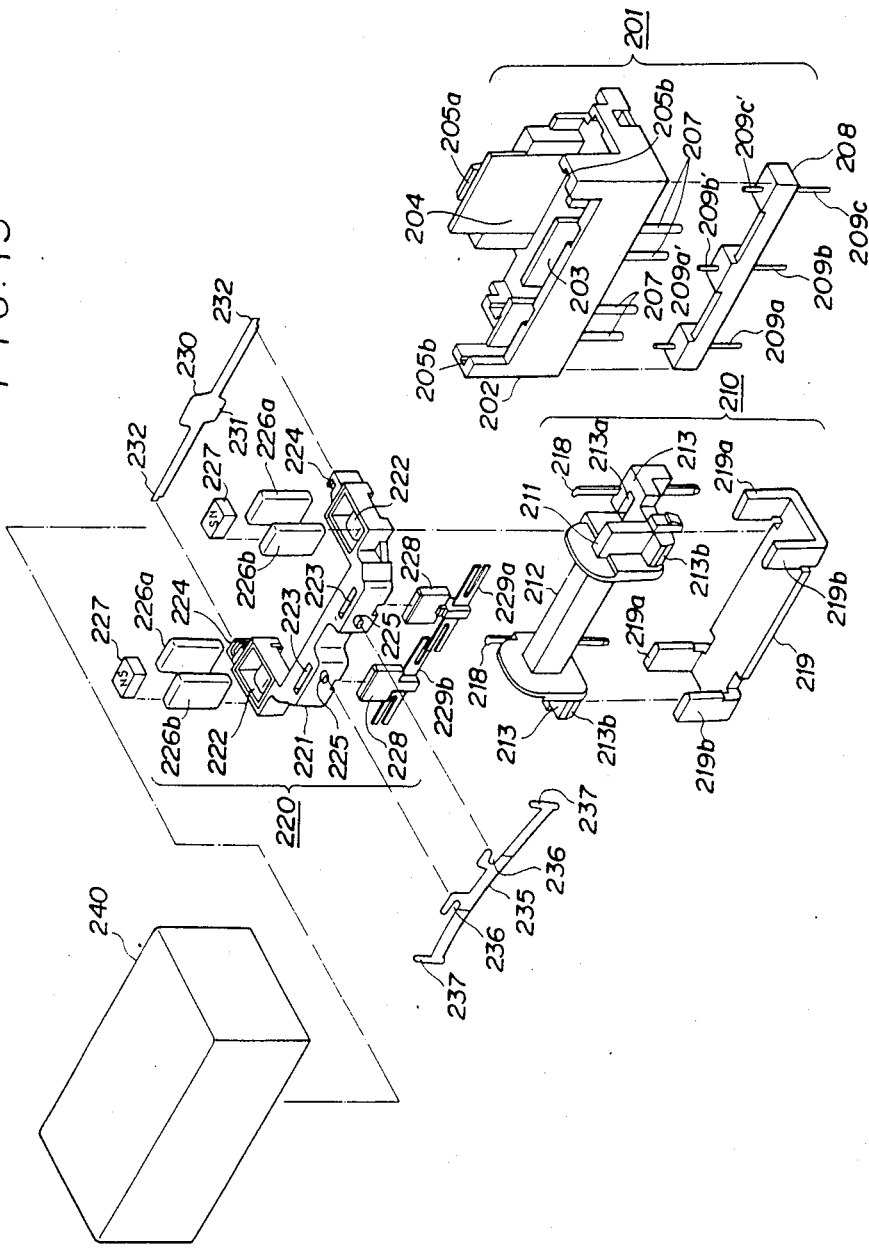
FIG. 13 is an exploded perspective view showing the detailed construction of a fifth preferred embodiment of the relay of the present invention.
Figure 14:
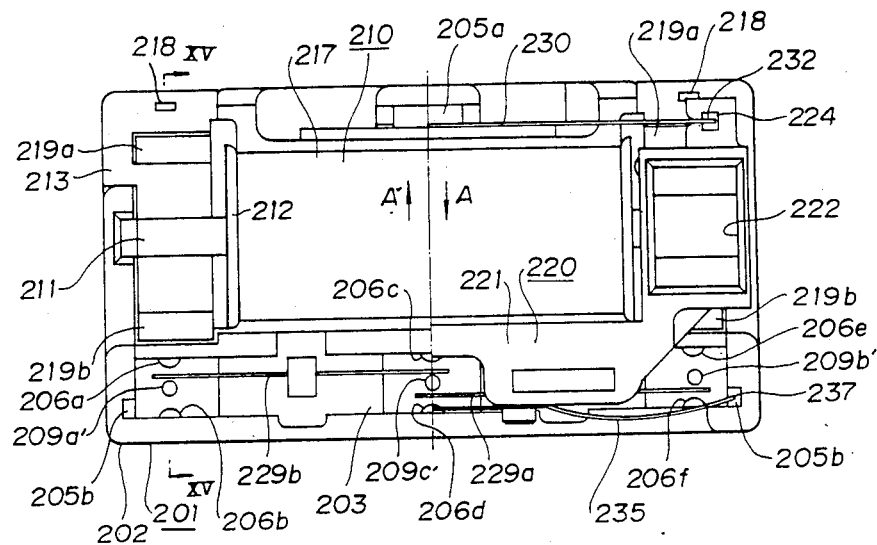
FIG. 14 is a plan view of said fifth preferred embodiment.
Figure 15:
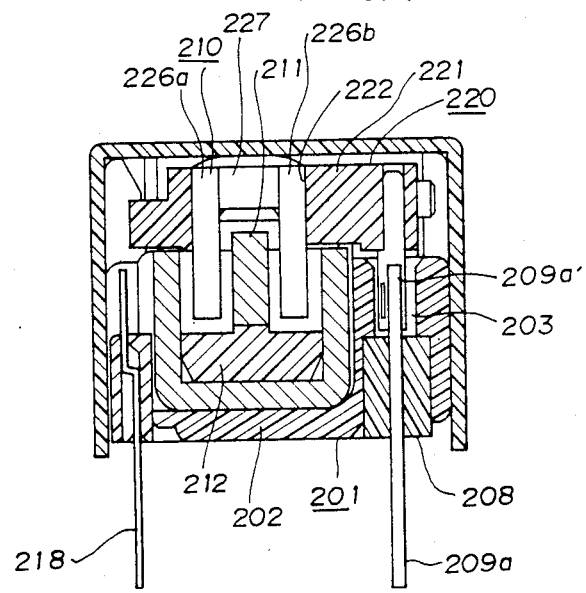
FIG. 15 is a sectional view through said fifth preferred embodiment, taken in a plane shown by the arrows XV—XV in FIG. 14.
Figure 16:
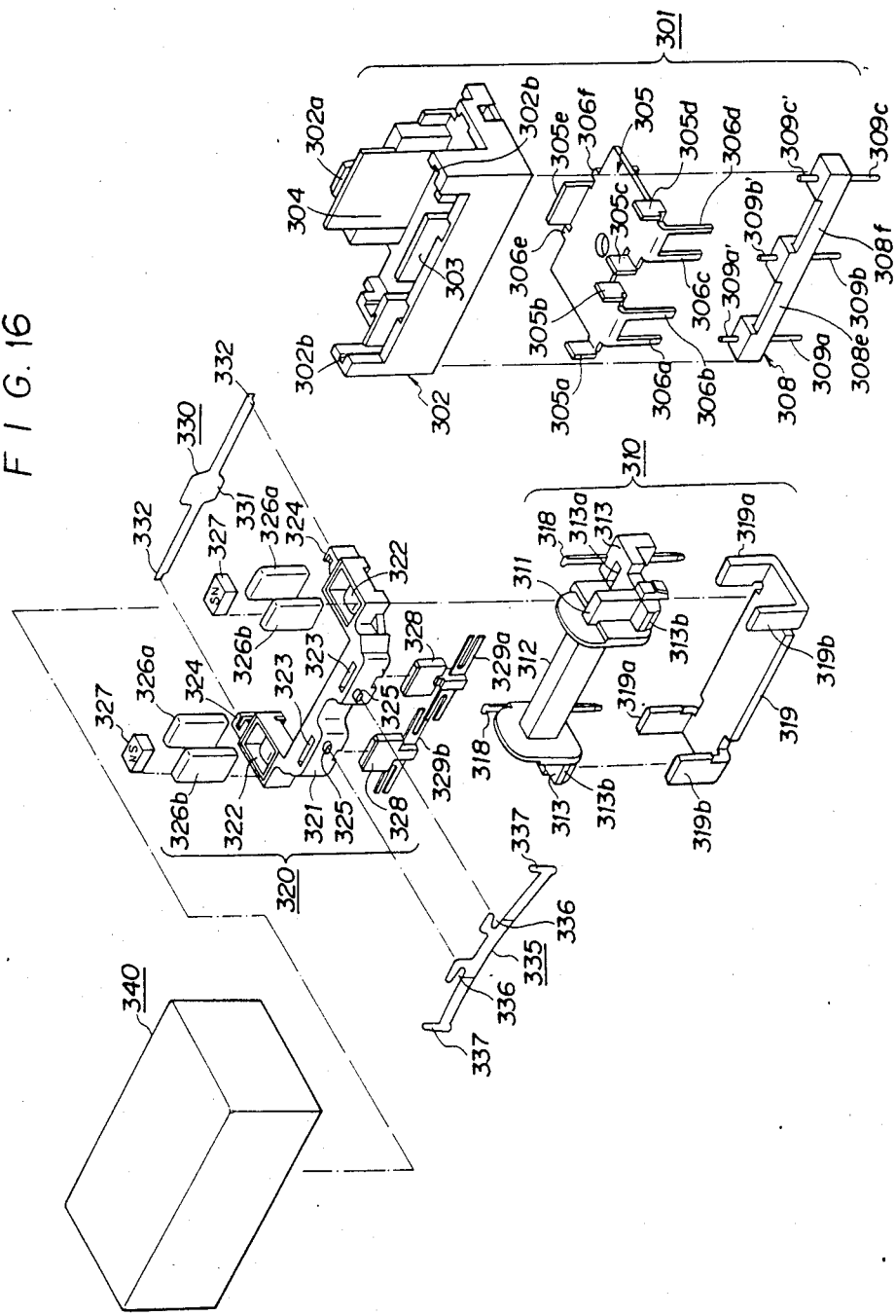
FIG. 16 is an exploded perspective view, similar to FIG. 13, showing the detailed construction of a sixth preferred embodiment of the relay of the present invention.
Figure 17:
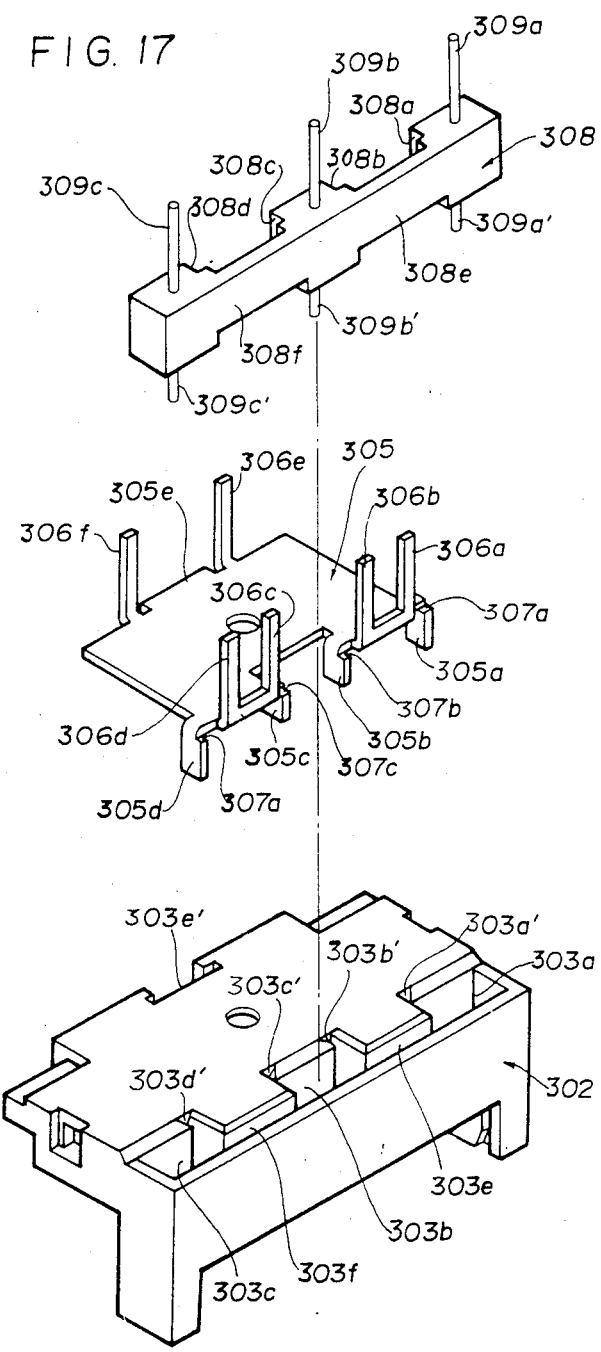
FIG. 17 is an exploded perspective view of a base and a terminal platform of said sixth preferred embodiment.
Figure 18:
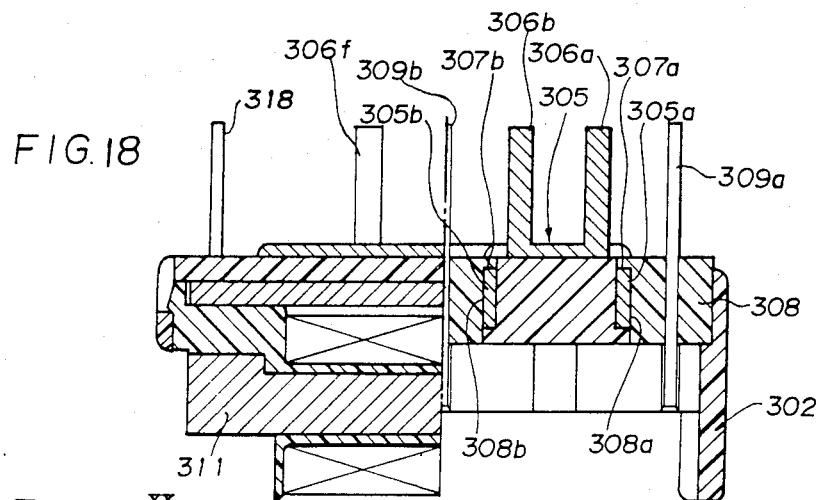
FIG. 18 is a sectional view of said base and said terminal platform.
Figure 19:
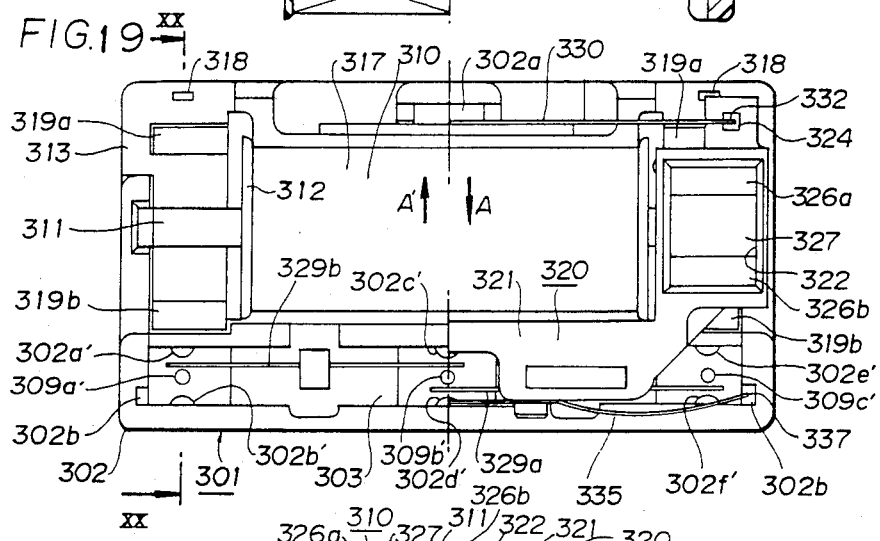
FIG. 19 is a plan view of said sixth preferred embodiment.
Figure 20:
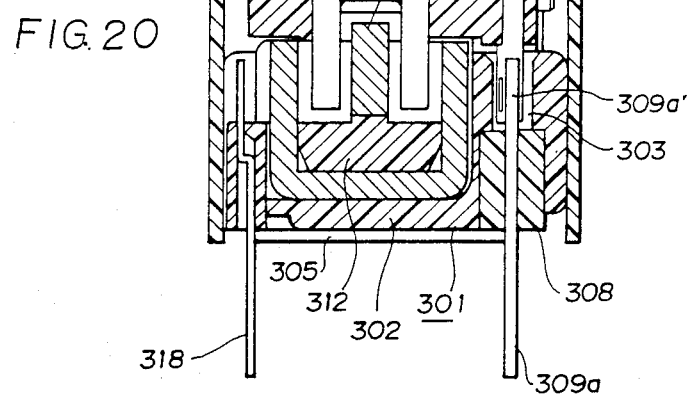
FIG. 20 is a sectional view through said sixth preferred embodiment, taken in a plane shown by the arrows XX—XX in FIG. 19.

Now, in FIGS. 13, 14, and 15, a fifth preferred embodiment of the relay of the present invention is shown. Referring to the exploded view of FIG. 13, this relay is substantially made up of a base assembly 201, an electromagnet assembly 210, an armature assembly 220, a pair of restoring springs 230 and 235, and an outer case 240.

The base assembly 201 comprises a base 202 integrally molded from synthetic resin and a terminal platform 208. The base 202 has a slot 203 formed therein, and the terminal platform 208 is fixedly secured in this slot 203 and has fixed terminals 209a, 209b, and 209c mounted in it. Upper contacts 209a', 209b', and 209c' of the terminals 209a, 209b, and 209c lie in the slot 203, and in this slot 203 there are provided ground contacts 206a through 206f on the walls of the slot 203 adjacent to each of the terminals 209a, 209b, and 209c on either side thereof (see FIG. 13). Out from the bottom of the base 202 there project four ground terminals 207, and these ground terminals 207 and the ground contacts 206a through 206f are electrically connected together by a thin electroconductive film of Cu-Ni deposited on the surface of the base 202. (Of course, this electroconductive film does not touch the fixed terminals 209a, 209b, and 209c).

The electromagnet assembly 210 comprises a spool 212 through the middle of which there is fitted an iron core 211 and on which there is wound a coil 217. The spool 212 is connected to a yoke member 219, which has two upward projecting pole pieces 219a and 219b at each of its ends which are positioned on the two sides of the corresponding projecting end of the iron core 211. In detail, the connection between the spool 212 and the yoke member 219 is accomplished by platform members 213 being fitted on either end of the spool 212 and by the upward projecting pole piecees 219a being fitted through slots 213a in the platform members 213 while the inside surfaces of the pole pieces 219b are contacted to the outer surfaces of side portions 213b of the platform members 213. And coil terminals 218, 218, are fixedly mounted in the platform members 213 and project downwards therefrom through appropriate holes in the base 212, not particularly shown.

The armature assembly 220 comprises a body portion 221 which is integrally molded from synthetic resin, and at each end of this body portion 221 there are mounted in frame portions 222 two plate pieces 226a and 226b and a permanent magnet 227 bridging between them so as to define a C-shape with the orientations of the permanent magnets 227, 227 opposite to one another. Further, insulated contact carrying members 228, 228 are fitted into holes 223 formed in said body portion 221, and each of these contact carrying members 228 carries a pair of springy contact pieces 229a and 229b extending on both its sides. The armature assembly 220 is so disposed that, at each of its ends, the plate pieces 226a and 226b are inserted into the aforementioned gaps defined between the end of the iron core 211 and the pole pieces 219a and 219b, with some movement remaining therebetween. And the armature assembly 220 is held in this position by two sheet springs 230 and 235 in such a fashion as to be movable transversely to and fro, against a restoring force provided by these sheet springs, through a certain distance in the directions A and A' (see FIG. 14).

The sheet spring 230 is fixed to the base 202 by its central portion 231 being fitted into a slot 205a formed in said base 202, and its end portions 232 are fitted into slots 224 formed in the body portion 221 of the armature assembly 220. On the other hand, the sheet spring 235 is fixed to the armature assembly 220 by hooked or notched shape portions 236 at its center portion (whose notch shape extends along the longitudinal direction of said sheet spring 235) being loosely fitted over corresponding projections 225 formed on the body portion 221 of said armature assembly 220, and its end portions 237, 237 are fitted into slots 205b formed in the base 202.

Specifically, when the electromagnetic coil 217 is deenergized, then, since in this particular embodiment the iron core 211 of the electromagnet assembly 210 is magnetized, an attractive force exists between the two end surfaces of the iron core 211 and the plate pieces 226b, 226b while a repulsive force exists between said end surfaces of the iron core 211 and the plate pieces 226a, 226a, and hence the armature assembly 220 moves in the direction of the arrow A' in FIG. 14, so that the two ends of the springy contact piece 229a contact the contacts 209b' and 209c', while the two ends of the springy contact piece 229b contact the ground contacts 206a and 206b and bend somewhat while doing so. On the other hand, when the electromagnetic coil 217 is energized, then an attractive force exists between the two end surfaces of the iron core 211 and the plate pieces 226a, 226a, while a repulsive force exists between said end surfaces of the iron core 211 and the plate pieces 226b, 226b, and hence the armature assembly 220 moves in the direction of the arrow A in FIG. 14, so that the two ends of the springy contact piece 229b contact the contacts 209a' and 209c', while the two ends of the springy contact piece 229a contact the ground contacts 206d and 206f and bend somewhat while doing so.

In other words, in this preferred embodiment, the armature assembly 220 moves to and fro in the directions of the arrows A and A' according to the energization or non energization of the coil 217, and switches the contacts 209a' and 209c', and 209b' and 209c'.

Since the sheet spring 235 is only loosely coupled to the armature assembly 220 by its central hooked portions 236 being loosely fitted over the projections 225 on the body portion 221, even when the forces of the spring portions on the two sides of said spring 235 differ somewhat, the spring 235 can shift according to this unbalance by the hooked or notched portions 236 shifting sideways on the projections 225, and thus even when the sheet spring 235 is irregular or asymmetric the parallel orientation of the armature assembly 220 to the coil 217 and the core 211 is maintained.

In FIGS. 16 through 20, a sixth preferred embodiment of the relay of the present invention is shown. Because this sixth embodiment is very similar to the fifth embodiment, just described, only the portions thereof which differ from said fifth embodiment and which are important for understanding the particular principles exemplified by this sixth embodiment will be described. In FIGS. 16 through 20, parts which correspond to parts of the fifth embodiment shown in FIGS. 13 through 15 are denoted by the same reference numerals increased by a hundred. The relay is substantially made up of a base assembly 301, an electromagnet assembly 310, an armature assembly 320, a pair of restoring springs 330 and 335, and an outer case 340. The particular part of this sixth embodiment which differs from the fifth embodiment is the base assembly 301, which will now be described.

This base assembly 301 comprises a base 302 integrally molded from synthetic resin and a terminal platform 308. The base 302 has a slot 303 formed therein, and the terminal platform 308 is fixedly secured in this slot 303 and has fixed terminals 309a, 309b, and 309c mounted in it. Upper contacts 309a', 309b', and 309c' of the terminals 309a, 309b, and 309c lie in the slot 303, and in this slot 303 there are provided ground contacts 302a' through 302f on the walls of the slot 303 adjacent to each of the terminals 309a, 309b, and 309c on either side thereof (see FIG. 19). And a grounding base board 305 is press formed out of copper plate, and has six integrally formed ground terminals 306a through 306f extending in the one direction therefrom (the direction out from the body of the relay) and five also integrally formed mounting lugs 305a through 305e extending in the other direction therefrom (into the body of the relay). The mounting lugs 305a through 305e are formed with notches 307a through 307e for positive engagement. On the lower surface of the base 302 there is deposited a thin electroconductive film of Cu-Ni or the like—of course, this electroconductive film does not touch the fixed terminals 309a, 309b, and 309c—and the grounding base board 305 is fixed to the lower side of the base 302 by being pressed against with the mounting lugs 305a through 305f slipping into and engaging positively (thanks to the notches 307a through 307e) with guide grooves 303a' through 303e' formed in the base 302. Thus the grounding base board 305 is in very good overall contact with the conducting coating film formed thereon for very good grounding. And the slot 303 in the base 302 is made up of slotlets 303e and 303f which communicate between larger sockets 303a, 303b, and 303c; these shapes are for receiving fatter portions of the terminal platform 308 which accomodate the terminals 309a through 309c and for receiving the thinner portions 308e and 308f of the terminal platform 308 joining these fatter portions.

The assembly process of this base assembly 301 will now be described. After the grounding base board 305 has been fitted to the base 302 as explained above by the mounting lugs 305a through 305e engaging with the guide grooves 303a' through 303e', then the terminal platform 308 is pushed into the slot 303, with the fatter terminal receiving portions thereof fitted into the socket shapes 303a, 303b, and 303c and with the thinner portions 308e and 308f fitted into the slotlets 303e and 303f, and with the side faces 308a through 308d defined on the terminal platform 308 (see FIG. 17) pushing strongly against the side inner surfaces of the socket shapes 303a, 303b, and 303c. Thereby a very good sealing structure is obtained. At this time, since the grounding base board 305 is very strongly and positively contacted against the conducting coating film formed on the outer surface of the base 302, a very good ground is obtained, and there is no problem as there was with the prior art of poor and restricted contact between the ground terminals and the conducting coating for shielding.

Also in this sixth and last preferred embodiment since the ground terminals 306a through 306d and the mounting lugs 305a through 305d are arranged on the opposite sides of the terminals 309a, 309b, and 309c, leakage of high frequency signals is well guarded against. And because the grounding base plate 305 is pressed hard against the base 302 and positively holds the terminal platform 308 in the slot 303 thereof, a very good sealing effect is obtained.

Although the present invention has been shown and described with reference to the preferred embodiments thereof, and in terms of the illustrative drawings, it should not be considered as limited thereby. Various possible modifications, omissions, and alterations could be conceived of by one skilled in the art to the form and the content of any particular embodiment, without departing from the scope of the present invention.

What is claimed is:

1. An electromagnetic relay, comprising: a non-metallic base formed with an insertion socket and provided with an electroconductive coating; a terminal platform having terminals mounted therein and fitted in said insertion socket; and a ground base board fixed against said base so as to pressingly hold said terminal platform in said socket and so as to contact said electroconductive coating.

2. An electromagnetic relay according to claim 1, wherein said ground base board is fixed against said base by mounting lugs.

3. An electromagnetic relay according to claim 1, wherein said ground base board is provided with at least one integrally formed grounding terminal.

4. An electromagnetic relay wherein a terminal platform having fixed terminals is fixed in an insertion hole provided in the bottom surface of a non-metallic base, wherein a connection portion which is integrally provided in a ground base board having a ground terminal is interposed between the insertion hole and the terminal platform in a pressure contacted state to secure the terminal platform to the base and is electrically connected to an electroconductive thin film provided on the inner side surface of the insertion hole.

5. An electromagnetic relay as defined in claim 4, wherein the connection portion and the ground terminal are provided between the fixed terminals.

6. An electromagnetic relay as defined in claim 4, wherein the terminal platform is press contacted and fixedly secured to the base by pressure inserting the connection portion into a guide groove located in the inner side surface of the insertion hole.

7. An electromagnetic relay comprising a plurality of contact terminals projecting from a non-metallic base having an electroconductive coating and, mounted on a printed circuit board for opening and closing a high frequency signal, wherein the contact terminals are surrounded by ground terminals which are provided on either side of the contact terminals and a projection in the base located between mutually opposing contact terminals which is electrically connected to the ground terminals by the electroconductive coating on the base and is electrically connected to a ground surface of the printed circuit board by contacting therewith, and a gap provided between the base and the printed circuit board.

8. An electromagnetic relay as defined in claim 7, wherein the electrical connection between the ground terminals and the projection is made by pressed contact between the electroconductive coating and a connecting body which connects the ground terminals.

9. An electromagnetic relay suitable to switch high frequency signals comprising:
   a non-metallic base formed with an insertion section and provided with an electroconductive coating;
   a terminal platform having a plurality of terminals mounted therein and fitted in said insertion section; and
   a ground base board fixed against said base so as to pressingly hold said terminal platform in said insertion section and so as to contact said electroconductive coating;
   said ground base board having a plurality of ground terminals which are settled within correspondent terminals of said terminal platform.

10. An electromagnetic relay according to claim 1, wherein said non-metallic base is comprised of a resin material.

11. An electromagnetic relay according to claim 4, wherein said non-metallic base is comprised of a resin material.

12. An electromagnetic relay according to claim 7, wherein said non-metallic base is comprised of a resin material.

13. An electromagnetic relay according to claim 9, wherein said non-metallic base is comprised of a resin material.

* * * * *